(12) United States Patent
Chen et al.

(10) Patent No.: US 8,053,838 B2
(45) Date of Patent: Nov. 8, 2011

(54) STRUCTURES, FABRICATION METHODS, DESIGN STRUCTURES FOR STRAINED FIN FIELD EFFECT TRANSISTORS (FINFETS)

(75) Inventors: Xiaomeng Chen, Poughkeepsie, NY (US); Byeong Yeol Kim, Lagrangeville, NY (US); Mahender Kumar, Fishkill, NY (US); Huilong Zhu, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 61 days.

(21) Appl. No.: 12/146,728

(22) Filed: Jun. 26, 2008

(65) Prior Publication Data

US 2009/0321828 A1 Dec. 31, 2009

(51) Int. Cl.
*H01L 29/00* (2006.01)
*H01L 21/20* (2006.01)

(52) U.S. Cl. ........... 257/347; 257/E29.001; 257/E21.09; 438/479

(58) Field of Classification Search .................... 257/347
See application file for complete search history.

(56) References Cited

U.S. PATENT DOCUMENTS

| | | | |
|---|---|---|---|
| 6,897,527 B2 | 5/2005 | Dakshina-Murthy et al. | |
| 7,193,279 B2 | 3/2007 | Doyle et al. | |
| 2004/0256647 A1* | 12/2004 | Lee et al. | 257/289 |
| 2006/0157687 A1* | 7/2006 | Doyle et al. | 257/19 |
| 2006/0211259 A1* | 9/2006 | Maes et al. | 438/762 |

* cited by examiner

*Primary Examiner* — Jarrett Stark
*Assistant Examiner* — Lawrence Tynes, Jr.
(74) *Attorney, Agent, or Firm* — Schmeiser, Olsen & Watts; Yuanmin Cai (57) ABSTRACT

A semiconductor structure, a fabrication method, and a design structure for a FinFet. The FinFet includes a dielectric layer, a central semiconductor fin region on the dielectric layer, a first semiconductor seed region on the dielectric layer, and a first strain creating fin region. The first semiconductor seed region is sandwiched between the first strain creating fin region and the dielectric layer. The first semiconductor seed region includes a first semiconductor material. The first strain creating fin region includes the first semiconductor material and a second semiconductor material different than the first semiconductor material. A first atom percent of the first semiconductor material in the first semiconductor seed region is different than a second atom percent of the first semiconductor material in the first strain creating fin region.

20 Claims, 13 Drawing Sheets

STRUCTURES, FABRICATION METHODS, DESIGN STRUCTURES FOR STRAINED FIN FIELD EFFECT TRANSISTORS (FINFETS)

FIELD OF THE INVENTION

The present invention relates generally to FinFets and more particularly to structures, fabrication methods, and design structures for strained FinFets.

BACKGROUND OF THE INVENTION

In a conventional FinFet, the channel of the FinFet is strained so as to improve the operation of the FinFet. Therefore, there is a need for structures, fabrication methods, and design structures for a FinFet that has higher strain in the channel region than that of the prior art.

SUMMARY OF THE INVENTION

The present invention provides a semiconductor structure, comprising a dielectric layer; a central semiconductor fin region on the dielectric layer; a first semiconductor seed region on the dielectric layer; and a first strain creating fin region, wherein the first semiconductor seed region is sandwiched between the first strain creating fin region and the dielectric layer, wherein the first semiconductor seed region comprises a first semiconductor material, wherein the first strain creating fin region comprises the first semiconductor material and a second semiconductor material different than the first semiconductor material, and wherein a first atom percent of the first semiconductor material in the first semiconductor seed region is different than a second atom percent of the first semiconductor material in the first strain creating fin region.

The present invention provides structures, fabrication methods, and design structures for a FinFet that has higher strain in the channel region than that of the prior art.

BRIEF DESCRIPTION OF THE DRAWINGS

FIG. 1L' shows a cross-section view of the semiconductor structure of FIG. 1L along a plane defined by a line 1L' of FIG. 1L, in accordance with embodiments of the present invention.

FIG. 2H' shows a cross-section view of the structure of FIG. 2H along a plane defined by a line 2H' of FIG. 2H, in accordance with embodiments of the present invention.

FIG. 2H" shows a cross-section view of the structure of FIG. 2H along a plane defined by a line 2H" of FIG. 2H, in accordance with embodiments of the present invention.

DETAILED DESCRIPTION OF THE INVENTION

FIGS. 1A-1L' illustrate a fabrication process of a semiconductor structure 100, in accordance with embodiments of the present invention. More specifically, with reference to FIG. 1A, the fabrication process of the semiconductor structure 100 can start with an SOI (Silicon On Insulator) substrate 110+120+130. The SOI substrate 110+120+130 can comprise a silicon layer 110, a dielectric layer 120 on top of the silicon layer 110, and a silicon fin layer 130 on top of the dielectric layer 120. The dielectric layer 120 can comprise silicon dioxide. The SOI substrate 110+120+130 can be formed by a conventional method.

Figure 1A:
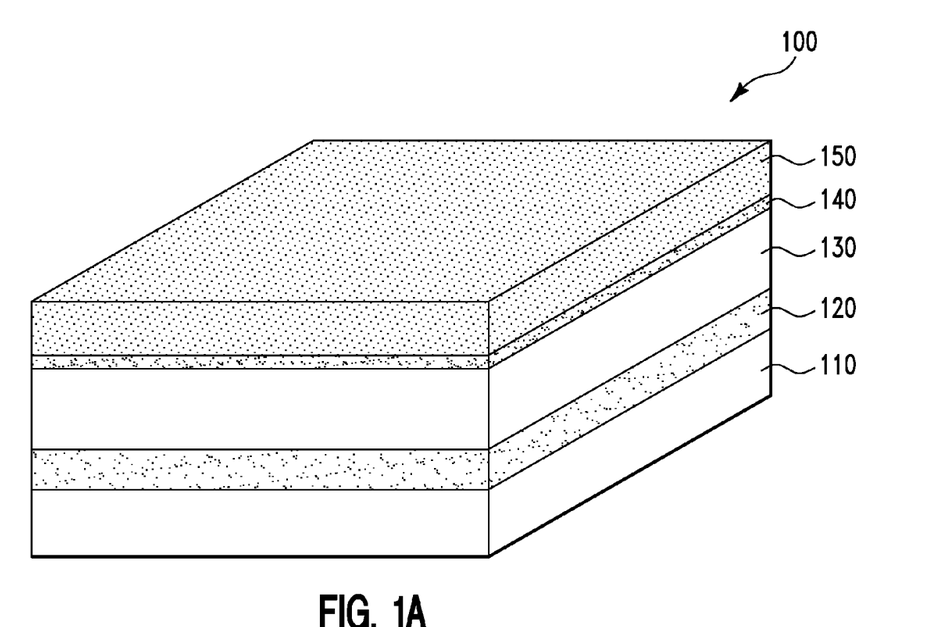
FIG. 1A shows a perspective view of a semiconductor structure for illustrating a fabrication process, in accordance with embodiments of the present invention.

Next, in one embodiment, a dielectric layer 140 is formed on top of the silicon fin layer 130. The dielectric layer 140 can comprise silicon dioxide. If silicon dioxide is used, the dielectric layer 140 can be formed by CVD (Chemical Vapor Deposition) of silicon dioxide on top of the silicon fin layer 130.

Next, in one embodiment, a nitride cap layer 150 is formed on top of the dielectric layer 140 resulting in the semiconductor structure 100 of FIG. 1A. The nitride layer 150 can be formed by CVD of silicon nitride on top of the dielectric layer 140.

Figure 1B:
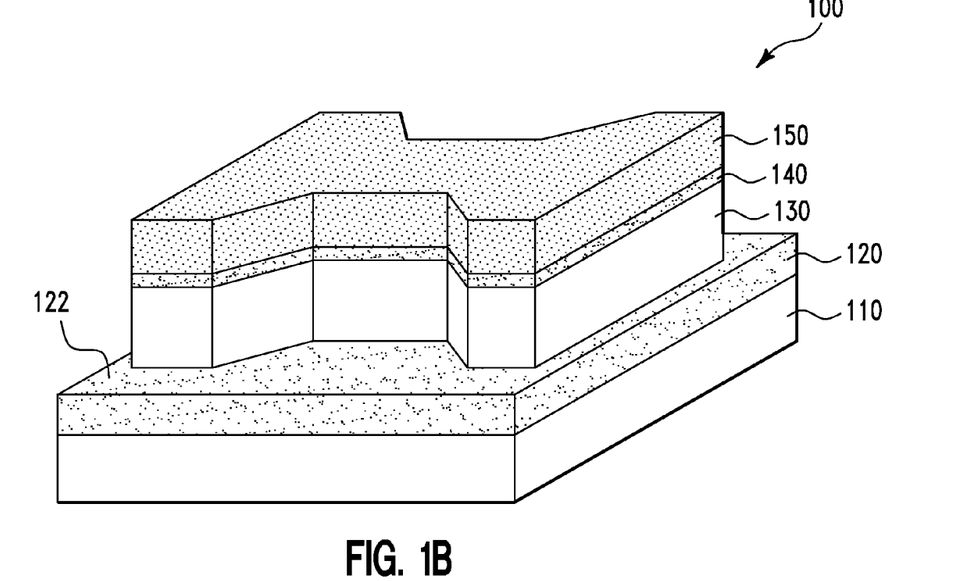
FIG. 1B shows a perspective view of a semiconductor structure resulting from patterning a nitride layer, a dielectric layer, and a silicon fin layer on the structure of FIG. 1A, in accordance with embodiments of the present invention.

Next, in one embodiment, the nitride layer 150, the dielectric layer 140, and the silicon fin layer 130 are patterned resulting in the nitride region 150, the dielectric region 140, and the silicon fin region 130, respectively, as shown in FIG. 1B. The nitride layer 150, the dielectric layer 140, and the silicon fin layer 130 can be patterned by conventional lithographic and etching processes.

Figure 1C:
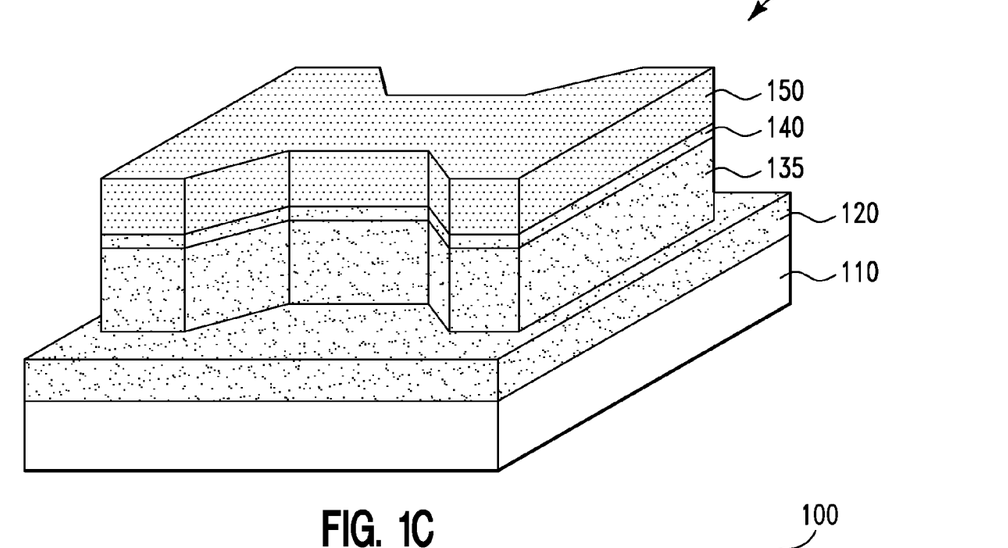
FIG. 1C shows a perspective view of a semiconductor structure resulting from forming a gate dielectric layer on the structure of FIG. 1B, in accordance with embodiments of the present invention.

Next, with reference to FIGS. 1B and 1C, in one embodiment, a gate dielectric layer 135 is formed on exposed surfaces of the silicon fin region 130. The gate dielectric layer 135 can comprise silicon dioxide. If silicon dioxide is used, the gate dielectric layer 135 can be formed by thermally oxidizing the exposed surfaces of the silicon fin region 130 resulting in the gate dielectric layer 135.

Figure 1D:
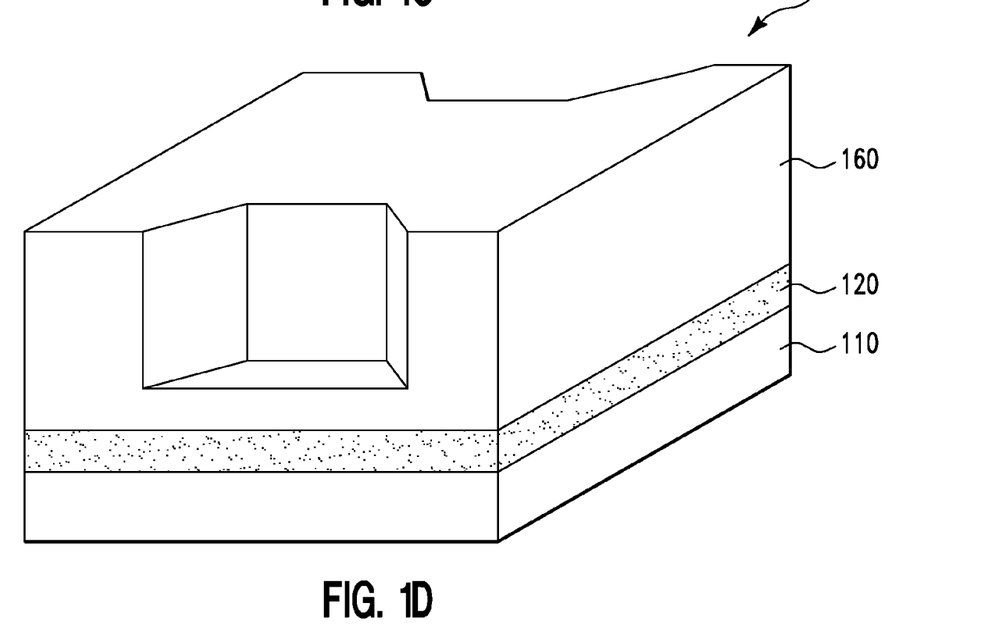
FIG. 1D shows a perspective view of a semiconductor structure resulting from forming a gate electrode layer on the structure of FIG. 1C, in accordance with embodiments of the present invention.

Next, with reference to FIG. 1D, in one embodiment, a gate electrode layer 160 is formed on top of the semiconductor structure 100 of FIG. 1C. The gate electrode layer 160 can comprise poly-silicon. If poly-silicon is used, the gate electrode layer 160 can be formed by depositing poly-silicon on top of the semiconductor structure 100 of FIG. 1C.

Figure 1E:
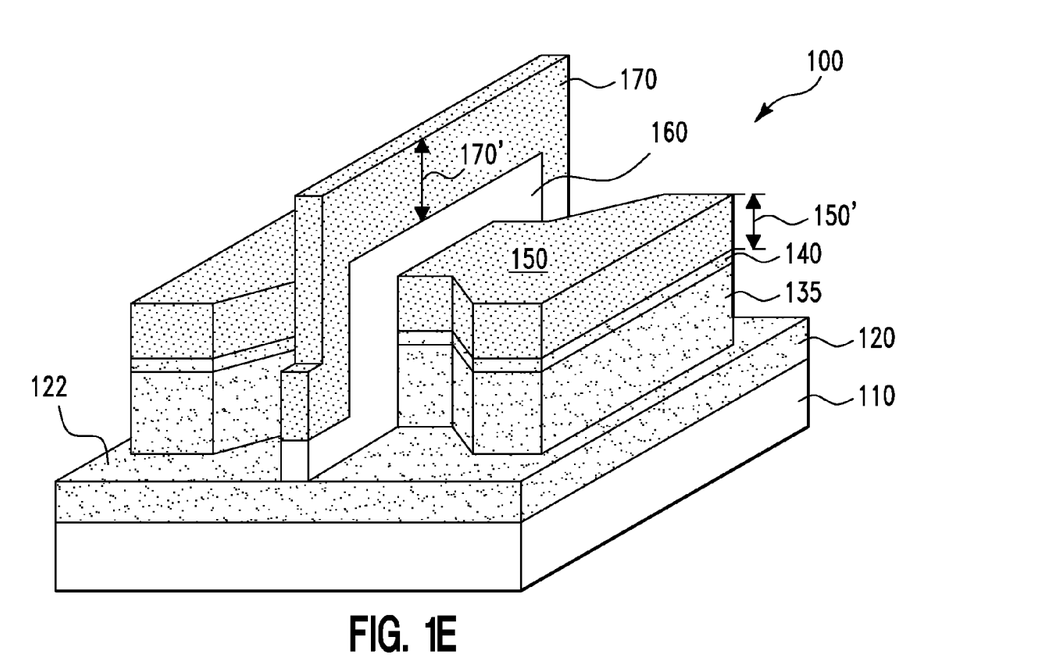
FIG. 1E shows a perspective view of a semiconductor structure resulting from forming a gate protecting region and a gate electrode region on the structure of FIG. 1D, in accordance with embodiments of the present invention.

Next, with reference to FIG. 1E, in one embodiment, a gate protecting region 170 and a gate electrode region 160 are formed. The gate protecting region 170 can comprise silicon nitride. The gate protecting region 170 and the gate electrode region 160 can be formed by (i) depositing a protecting layer (not shown) on top of the gate electrode layer 160 of FIG. 1D and then (ii) patterning the protecting layer and the gate electrode layer 160 resulting in the gate protecting region 170 and the gate electrode region 160 of FIG. 1E, respectively. In one embodiment, the gate protecting region 170 is formed such that the thickness 170' of the gate protecting region 170 is greater than the thickness 150' of the nitride layer 150.

Figure 1F:
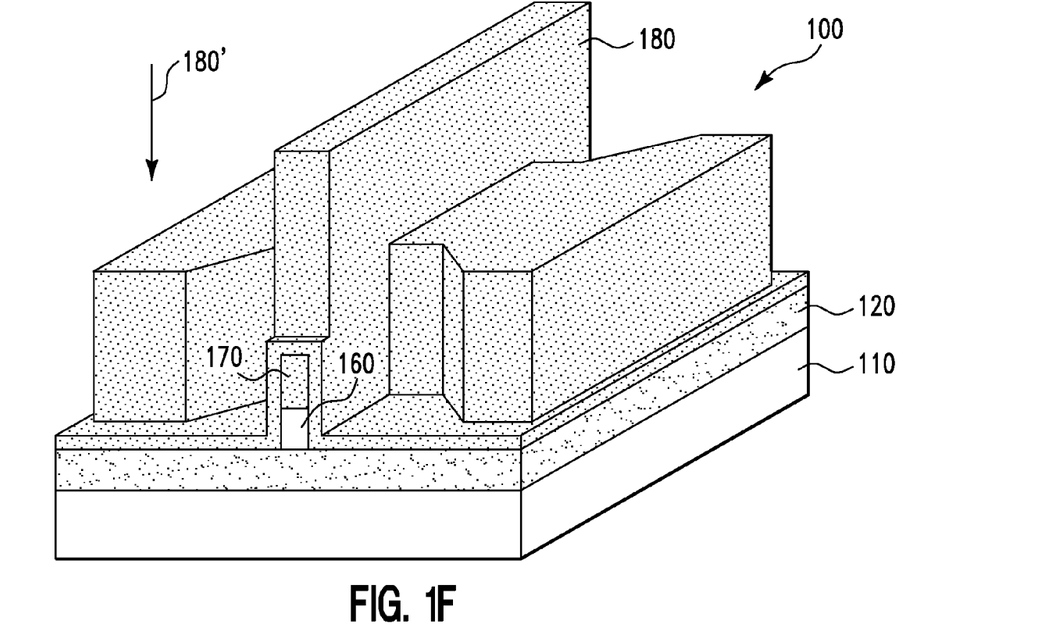
FIG. 1F shows a perspective view of a semiconductor structure resulting from forming a cap layer on the structure of FIG. 1E, in accordance with embodiments of the present invention.

Next, with reference to FIG. 1F, in one embodiment, a cap layer 180 is formed on top of the structure 100 of FIG. 1E. The cap layer 180 can comprise silicon nitride. If silicon nitride is used, the cap layer 180 can be formed by CVD of silicon nitride on top of the structure 100 of FIG. 1E.

Figure 1G:
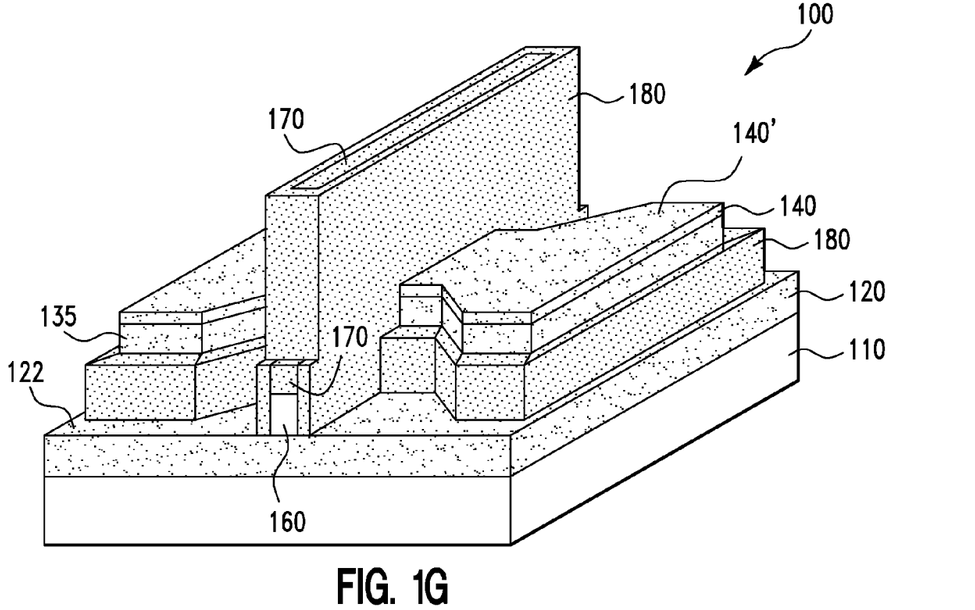
FIG. 1G shows a perspective view of a semiconductor structure resulting from forming a cap region on the structure of FIG. 1F, in accordance with embodiments of the present invention.

Next, with reference to FIGS. 1F and 1G, in one embodiment, the cap layer 180 is anisotropically etched such that (i) the top surface 140' of the dielectric region 140 is exposed to the surrounding ambient and that (ii) the gate electrode region 160 remains being covered by the cap layer 180 and the gate protecting region 170 resulting in the cap region 180 of FIG. 1G. More specifically, in one embodiment, the cap layer 180 is anisotropically etched in a direction 180' that is perpendicular to the top surface 122 of the dielectric layer 120.

Figure 1H:
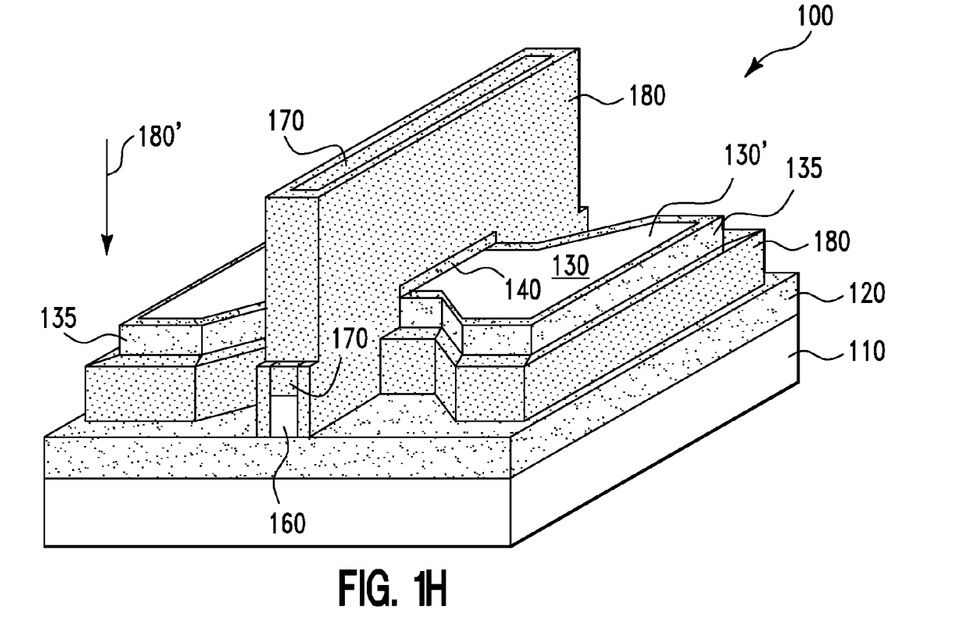
FIG. 1H shows a perspective view of a semiconductor structure resulting from etching a dielectric layer on the structure of FIG. 1G, in accordance with embodiments of the present invention.

Next, in one embodiment, the silicon dioxide region 140 is selectively etched until the top surface 130' of the silicon fin region 130 is exposed to the surrounding ambient resulting in the structure 100 of FIG. 1H such that the nitride gate protecting region 170 and the nitride cap region 180 remain essentially intact. More specifically, in one embodiment, the dielectric region 140 is anisotropically etched in the direction 180'.

Figure 1I:
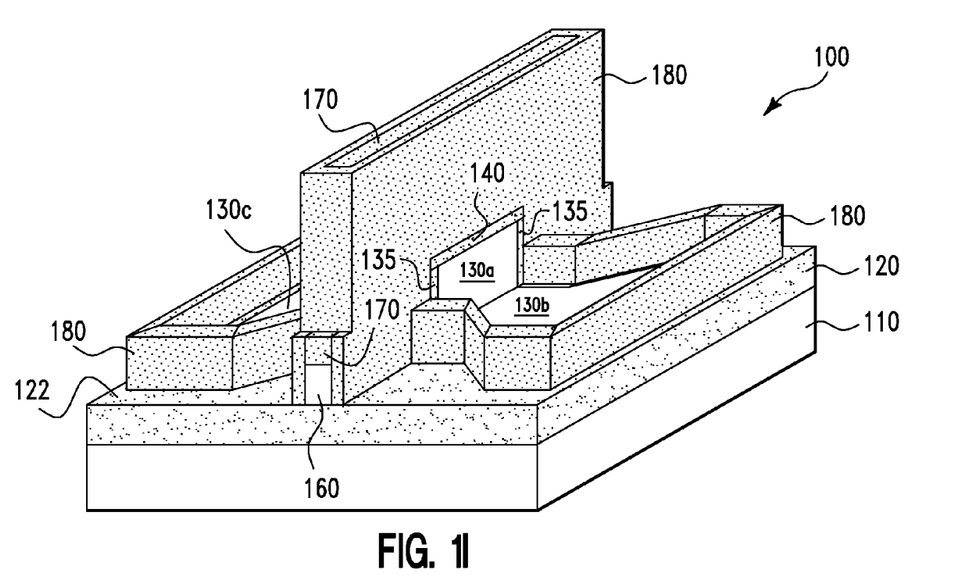
FIG. 1I shows a perspective view of a semiconductor structure resulting from partially removing a silicon fin region on the structure of FIG. 1H, in accordance with embodiments of the present invention.

Next, in one embodiment, the silicon fin region 130 is partially removed resulting in the silicon fin region 130a and silicon seed regions 130b and 130c on top of the dielectric layer 120, as shown in FIG. 1I. More specifically, the silicon fin region 130 can be partially removed by selectively etching the silicon fin region 130 in the direction 180' with the nitride gate protecting region 170 and the nitride cap region 180 as blocking masks and stopping before the top surface 122 of the dielectric layer 120 is exposed to the surrounding ambient. It should be noted that the silicon fin region 130a and the silicon seed regions 130b and 130c are what remains of the silicon fin region 130 after the etching of the silicon fin region 130. The silicon seed regions 130b and 130c are on top of and in direct physical contact with the dielectric layer 120.

Figure 1J:
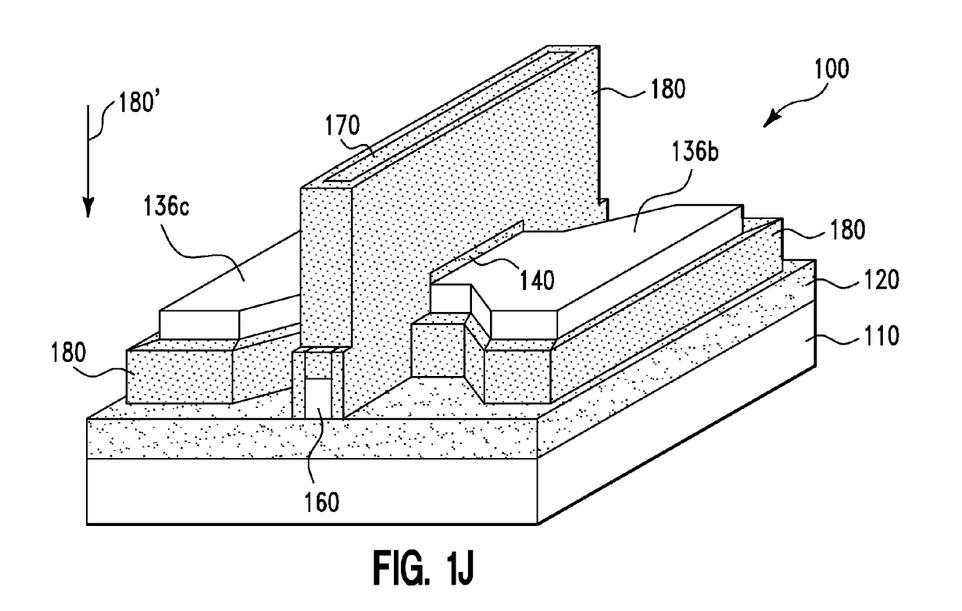
FIG. 1J shows a perspective view of a semiconductor structure resulting from forming strain creating fin regions on the structure of FIG. 1I, in accordance with embodiments of the present invention.

Next, with reference to FIGS. 1I and 1J, in one embodiment, strain creating fin regions 136b and 136c are formed on the silicon seed regions 130b and 130c, respectively, such that the strain creating fin region 136b is in direct physical contact with the silicon seed region 130b and the silicon fin region 130a, whereas the strain creating fin region 136c is in direct physical contact with the silicon seed region 130c and the silicon fin region 130a. The strain creating fin regions 136b and 136c can comprise SiGe (a mixture of Si and Ge) or SiC (a mixture of Si and C). More specifically, if the structure 100 is to be a PFET (p-channel field effect transistor), then the strain creating fin regions 136b and 136c can comprise SiGe. If the structure 100 is to be a NFET (n-channel FET), then the strain creating fin regions 136b and 136c can comprise SiC. In one embodiment, the strain creating fin regions 136b and 136c are simultaneously formed by an epitaxial growth process of SiGe or SiC from the silicon fin region 130a and the silicon seed regions 130b and 130c.

It should be noted that the atom percent of silicon in the silicon seed region 130b is different than the atom percent of silicon in the strain creating fin regions 136b. The atom percent of a material in a region is defined as 100 multiplied by a ratio of the number of atoms of the material in the region to the total number of atoms in the region. It should also be noted that the atom percent of silicon in the silicon seed region 130c is different than the atom percent of silicon in the strain creating fin regions 136c. In one embodiment, the atom percent of silicon in the strain creating fin regions 136b is essentially equal to the atom percent of silicon in the strain creating fin regions 136c.

It should be noted that, with reference to FIG. 1J, with the presence of the cap region 180, the strain creating fin regions 136b and 136c do not come into direct physical contact with the gate electrode region 160.

Figure 1K:
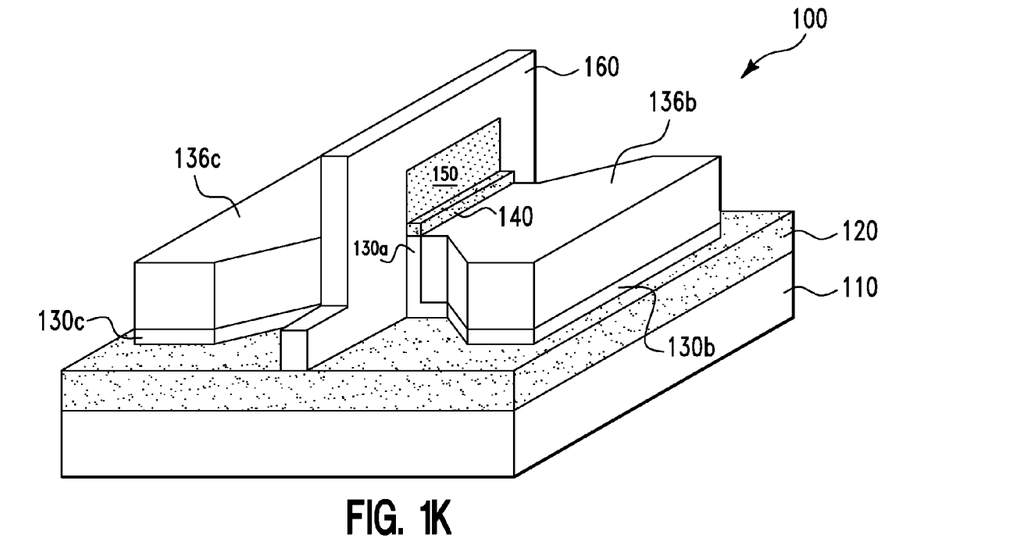
FIG. 1K shows a perspective view of a semiconductor structure resulting from removing a cap region and a gate protecting region on the structure of FIG. 1J, in accordance with embodiments of the present invention.

Next, in one embodiment, the cap region 180 and the gate protecting region 170 are removed resulting in the structure 100 of FIG. 1K. More specifically, the cap region 180 and the gate protecting region 170 can be removed by a conventional selective etching process in the direction 180'. It should be noted that the gate electrode region 160 is electrically insulated from the silicon fin region 130a by the gate dielectric layer 135 (can be seen in FIG. 1I but not shown in FIG. 1K for simplicity).

Next, with reference to FIG. 1K, in one embodiment, halo and extension regions (not shown) are formed in the silicon fin region 130a and the strain creating fin regions 136b and 136c. The halo and extension regions can be formed by conventional ion implantation processes.

Figure 1L:
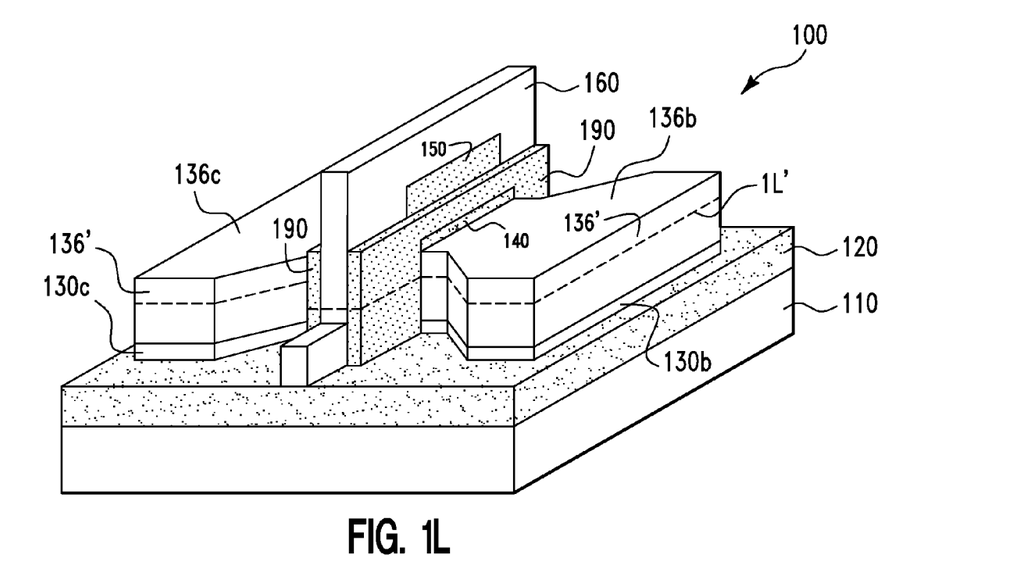
FIG. 1L shows a perspective view of a semiconductor structure resulting from forming spacer regions and source/drain regions on the structure of FIG. 1K, in accordance with embodiments of the present invention.

Next, with reference to FIG. 1L, in one embodiment, spacer regions 190 are formed on side walls of the gate electrode region 160 and the nitride region 150. The spacer regions 190 can comprise silicon nitride. If silicon nitride is used, the spacer regions 190 can be formed by (i) depositing a silicon nitride layer on top of the structure 100 of FIG. 1K and then (ii) etching back the silicon nitride layer resulting in the structure 100 of FIG. 1L.

Next, in one embodiment, source/drain regions 138b and 138c (not shown in FIG. 1L but can be seen in FIG. 1L') are formed in the strain creating fin regions 136b and 136c. The source/drain regions 138b and 138c can be formed by a conventional ion implantation process. FIG. 1L' shows a cross-section view of the structure 100 of FIG. 1L along a plane defined by a line 1L' of FIG. 1L after the source/drain regions 138b and 138c are formed. The gate electrode region 160, gate dielectric regions 135 and the source/drain regions 138b and 138c form a transistor with the gate electrode region 160 functioning as a gate electrode 160 of the transistor.

Next, in one embodiment, interconnect layers (not shown) are formed on top of the structure 100 to provide electrical access to the transistor of FIG. 1L.

The inventors of the present invention have found that, with reference to FIG. 1I, if the silicon seed regions 130b and 130c are not present (i.e., the silicon fin region 130 is etched until the top surface 122 of the dielectric layer 120 is exposed to the surrounding ambient), then the strain in the channel regions 130a1 and 130a2 (FIG. 1L') in the silicon fin region 130a created by the strain creating fin regions 136b and 136c which are grown from only the silicon fin region 130a is lower than the strain in the channel regions 130a1 and 130a2 in the silicon fin region 130a created by the strain creating fin regions 136b and 136c which are grown from the silicon fin region 130a and the silicon seed regions 130b and 130c.

In summary, in the formation of the transistor of FIG. 1L, the presence of the strain creating fin regions 136b and 136c which grow from the silicon seed regions 130b and 130c (FIG. 1I) creates high strain to the channel regions 130a1 and 130a2 (FIG. 1L') in the silicon fin region 130a resulting in enhanced performance of the transistor.

Figure 2A:
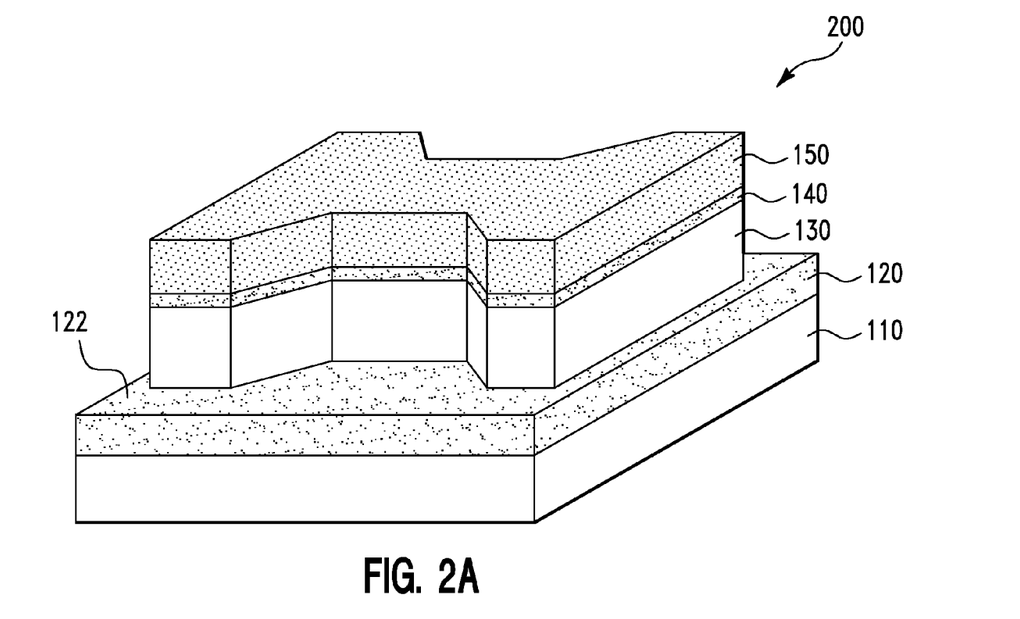
FIG. 2A shows a perspective view of another semiconductor structure for illustrating a fabrication process, in accordance with embodiments of the present invention.

FIGS. 2A-2H' illustrate a fabrication process of a semiconductor structure 200, in accordance with embodiments of the present invention. More specifically, with reference to FIG. 2A, the fabrication process of the semiconductor structure 200 can start with the structure 200 of FIG. 2A. The semiconductor structure 200 of FIG. 2A is similar to the semiconductor structure 100 of FIG. 1B. The formation of the semiconductor structure 200 of FIG. 2A is similar to the formation of the semiconductor structure 100 of FIG. 1B.

Figure 2B:
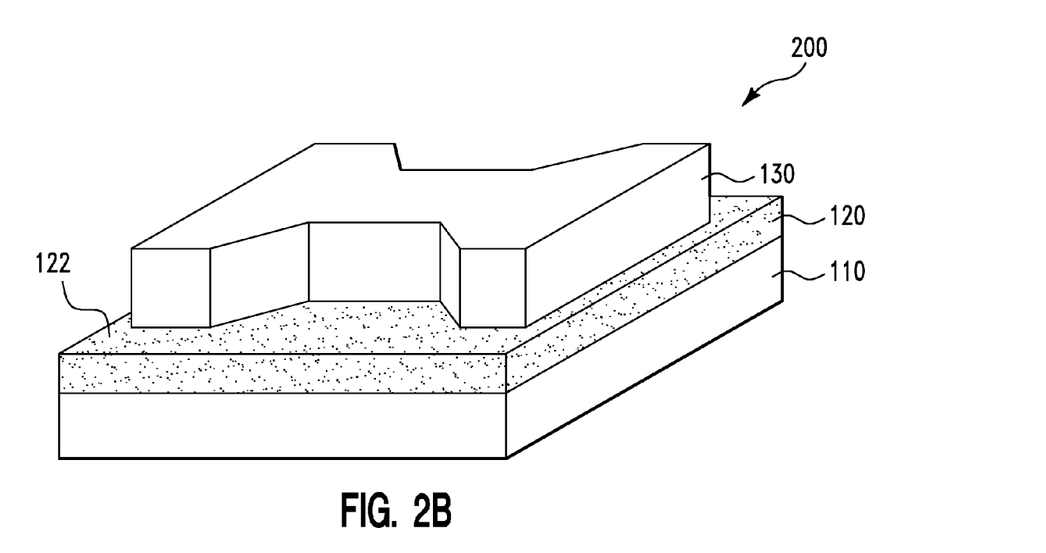
FIG. 2B shows a perspective view of a semiconductor structure resulting from removing a nitride layer and a dielectric layer on the structure of FIG. 2A, in accordance with embodiments of the present invention.

Next, in one embodiment, the nitride layer 150 and the dielectric layer 140 are removed resulting in the semiconductor structure 200 of FIG. 2B. More specifically, the nitride layer 150 and the dielectric layer 140 can be removed by conventional etching processes.

Figure 2C:
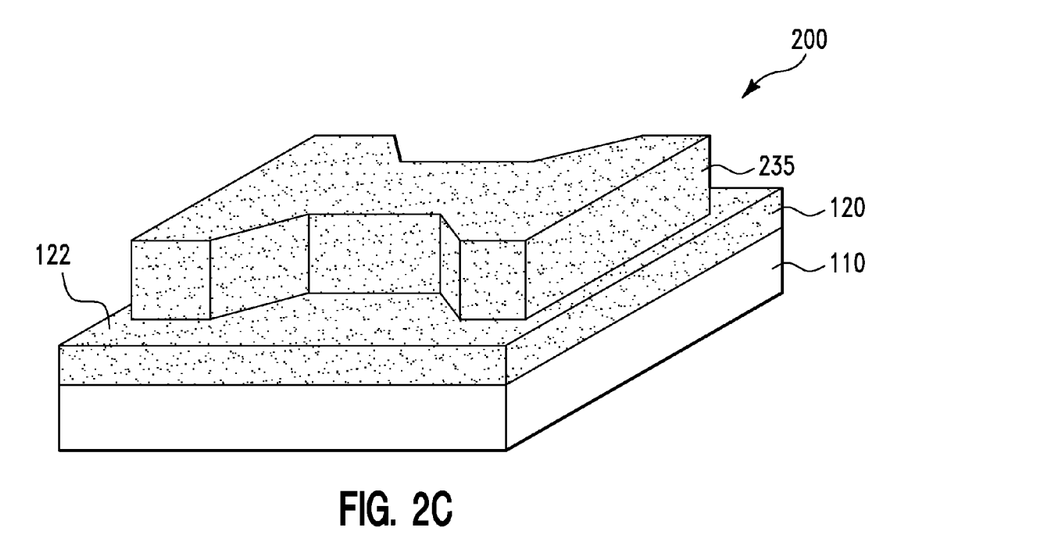
FIG. 2C shows a perspective view of a semiconductor structure resulting from forming a gate dielectric layer on the structure of FIG. 2B, in accordance with embodiments of the present invention.

Next, with reference to FIGS. 2B and 2C, a gate dielectric layer 235 is formed on the silicon fin region 130. The gate dielectric layer 235 can comprise silicon dioxide. If silicon dioxide is used, the gate dielectric layer 235 can be formed by thermally oxidizing the exposed surfaces of the silicon fin region 130 resulting in the gate dielectric layer 235.

Figure 2D:
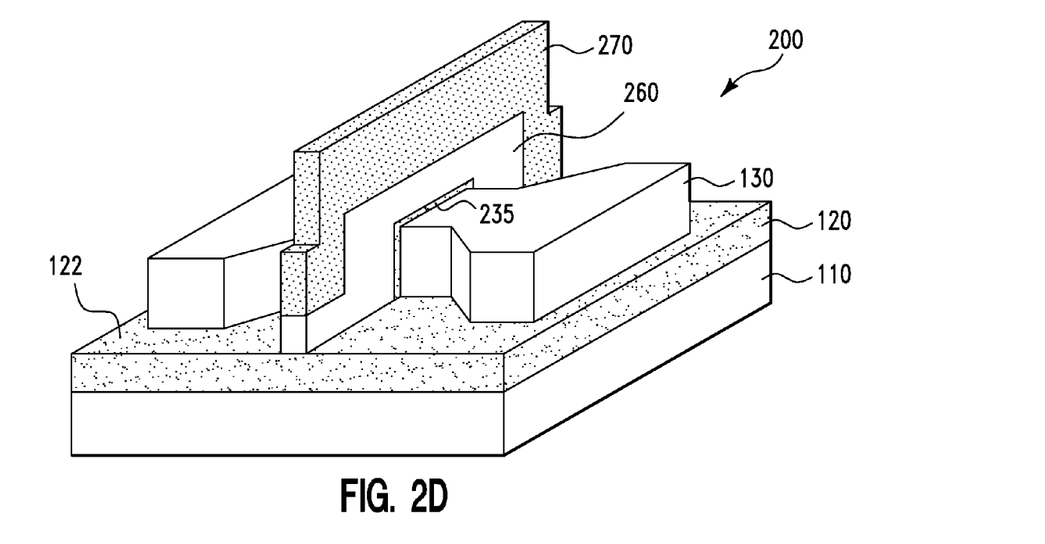
FIG. 2D shows a perspective view of a semiconductor structure resulting from forming a gate dielectric layer on the structure of FIG. 2C, in accordance with embodiments of the present invention.

Next, with reference to FIG. 2D, in one embodiment, a gate dielectric region 235, a gate electrode region 260, and a gate protecting region 270 are formed on the semiconductor structure 200 of FIG. 2C. The gate electrode region 260 can comprise poly-silicon. The gate protecting region 270 can comprise silicon nitride. The gate electrode region 260 and the gate protecting region 270 can be formed in a manner similar to the manner in which the gate electrode region 160 and the gate protecting region 170 of the semiconductor structure 100 of FIG. 1E are formed. The gate dielectric region 235 is what remains of the gate dielectric layer 235 after the formation of the gate electrode region 260 and the gate protecting region 270.

Figure 2E:
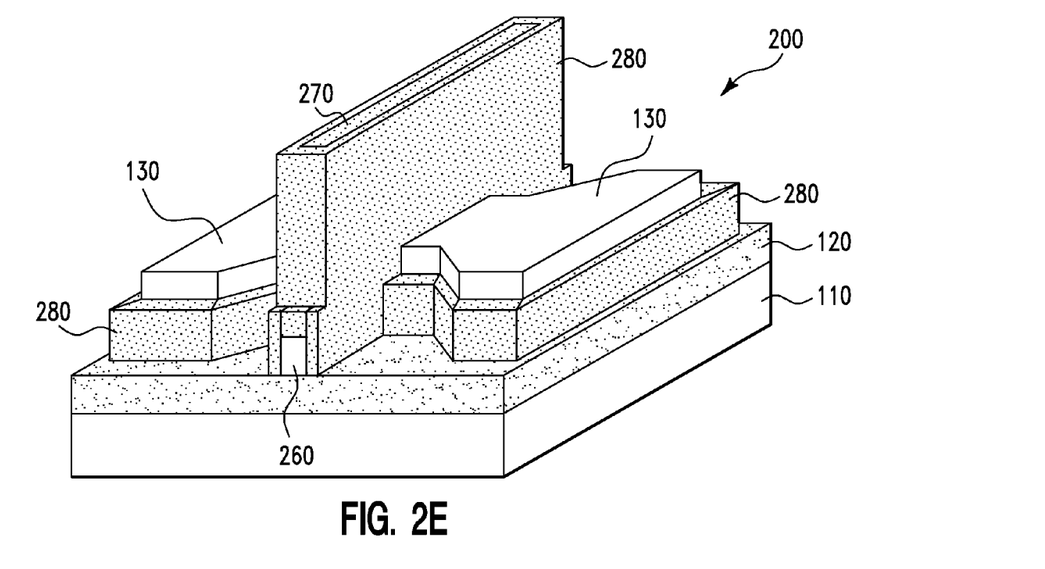
FIG. 2E shows a perspective view of a semiconductor structure resulting from forming a gate dielectric region, a gate electrode region, and a gate protecting region on the structure of FIG. 2D, in accordance with embodiments of the present invention.

Next, with reference to FIG. 2E, in one embodiment, a cap region 280 is formed on the semiconductor structure 200 of FIG. 2D. The cap region 280 can comprise silicon nitride. The cap region 280 can be formed in a manner similar to the manner in which the cap region 180 of FIG. 1G is formed.

Figure 2F:
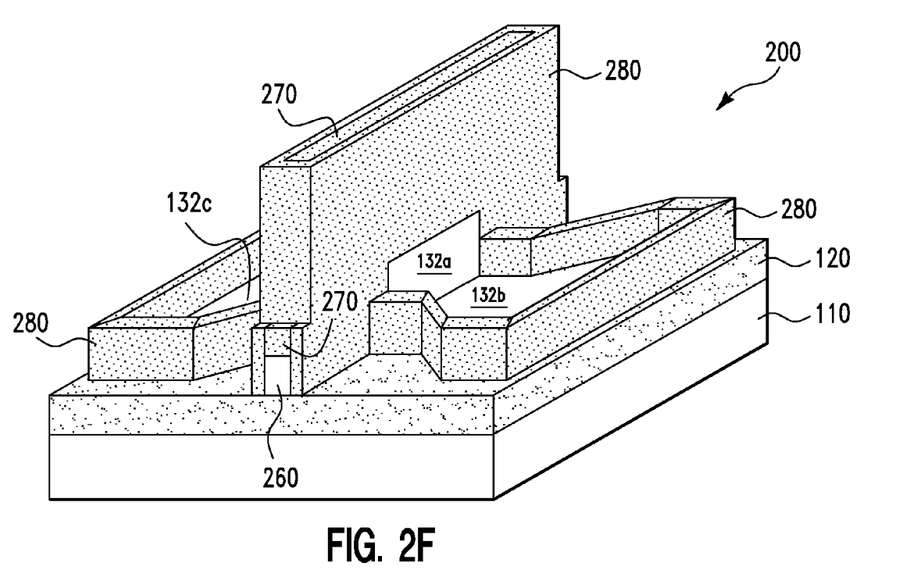
FIG. 2F shows a perspective view of a semiconductor structure resulting from partially removing a silicon fin region on the structure of FIG. 2E, in accordance with embodiments of the present invention.

Next, in one embodiment, the silicon fin region 130 is partially removed resulting in a silicon fin region 132a and silicon seed regions 132b and 132c on top of the dielectric layer 120, as shown in FIG. 2F. More specifically, the silicon fin region 130 can be partially removed in a manner similar to the manner in which the silicon fin region 130 of FIG. 1H is partially removed so as to form the silicon fin region 130a and silicon seed regions 130b and 130c of FIG. 1I. It should be noted that the silicon seed regions 132b and 132c are on top of and in direct physical contact with the dielectric layer 120.

Figure 2G:
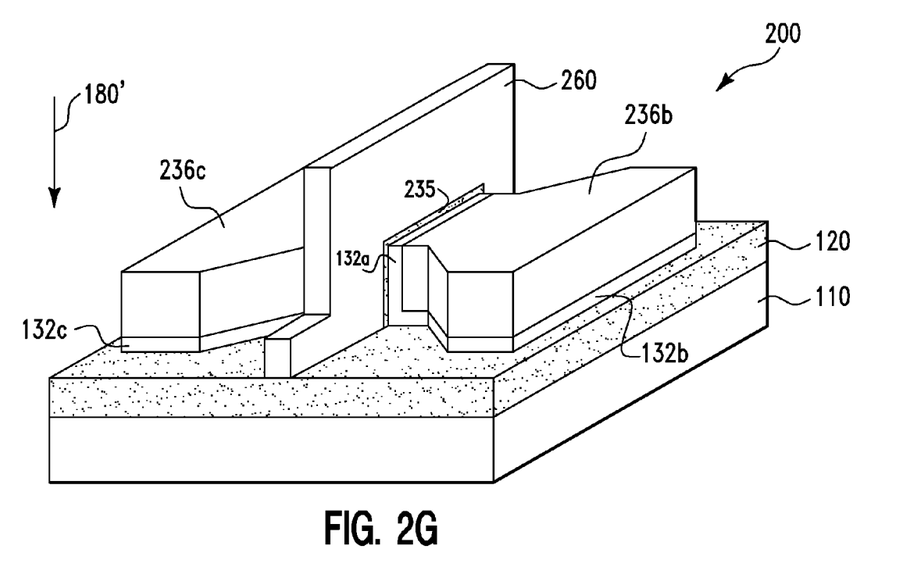
FIG. 2G shows a perspective view of a semiconductor structure resulting from forming strain creating fin regions on the structure of FIG. 2F, in accordance with embodiments of the present invention.

Next, in one embodiment, strain creating fin regions 236b and 236c (FIG. 2G) are formed on the silicon seed regions 132b and 132c, respectively, and then the gate electrode region 260 and the gate protecting region 270 are removed resulting in the semiconductor structure 200 of FIG. 2G. The strain creating fin regions 236b and 236c can comprise SiGe or SiC. The formation of the strain creating fin regions 236b and 236c is similar to the formation of the strain creating fin regions 136b and 136c of FIG. 1J. The gate electrode region 260 and the gate protecting region 270 can be removed by a conventional selective etching process in the direction 180'.

Next, with reference to FIG. 2G, in one embodiment, halo and extension regions (not shown) are formed in the silicon fin region 132a and the strain creating fin regions 236b and 236c. The halo and extension regions can be formed by conventional ion implantation processes.

Figure 2H:
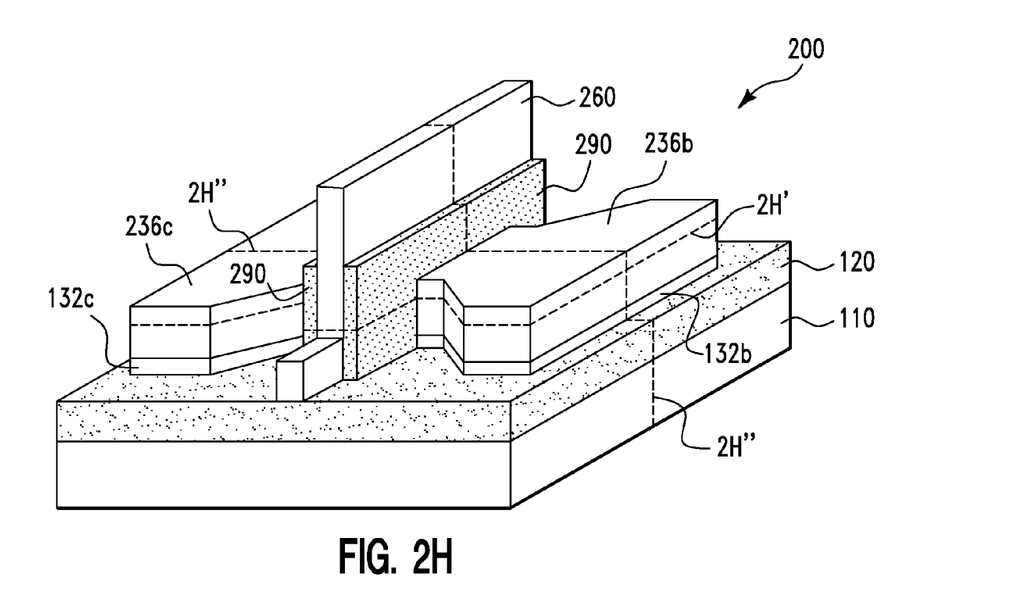
FIG. 2H shows a perspective view of a semiconductor structure resulting from forming spacer regions and source/drain regions on the structure of FIG. 2G, in accordance with embodiments of the present invention.

Next, with reference to FIG. 2H, in one embodiment, spacer regions 290 are formed on side walls of the gate electrode region 260. The spacer regions 290 can comprise silicon nitride. The formation of the spacer regions 290 is similar to the formation of the spacer regions 190 of FIG. 1L.

Next, in one embodiment, source/drain regions 238b and 238c (not shown in FIG. 2H but can be seen in FIGS. 2H' and 2H") are formed in the strain creating fin regions 236b and 236c. The source/drain regions 238b and 238c can be formed by a conventional ion implantation process. FIG. 2H' shows a cross-section view of the structure 200 of FIG. 2H along a plane defined by a line 2H' of FIG. 2H after the source/drain regions 238b and 238c are formed. FIG. 2H" shows a cross-section view of the structure 200 of FIG. 2H along a plane defined by a line 2H" of FIG. 2H after the source/drain regions 238b and 238c are formed. With reference to FIGS. 2H' and 2H", the gate electrode region 260, gate dielectric regions 235 and the source/drain regions 238b and 238c form a transistor with the gate electrode region 260 functioning as a gate electrode 260 of the transistor.

Next, in one embodiment, interconnect layers (not shown) are formed on top of the structure 200 to provide electrical access to the transistor of FIG. 2H.

In summary, in the formation of the transistor of FIG. 2H, the presence of the strain creating fin regions 236b and 236c which grow from the silicon seed regions 132b and 132c (FIG. 2F) creates high strain to channel regions 132a1, 132a2, and 132a3 (FIGS. 2H' and 2H") in the silicon fin region 132a resulting in enhanced performance of the transistor.

Figure 3:
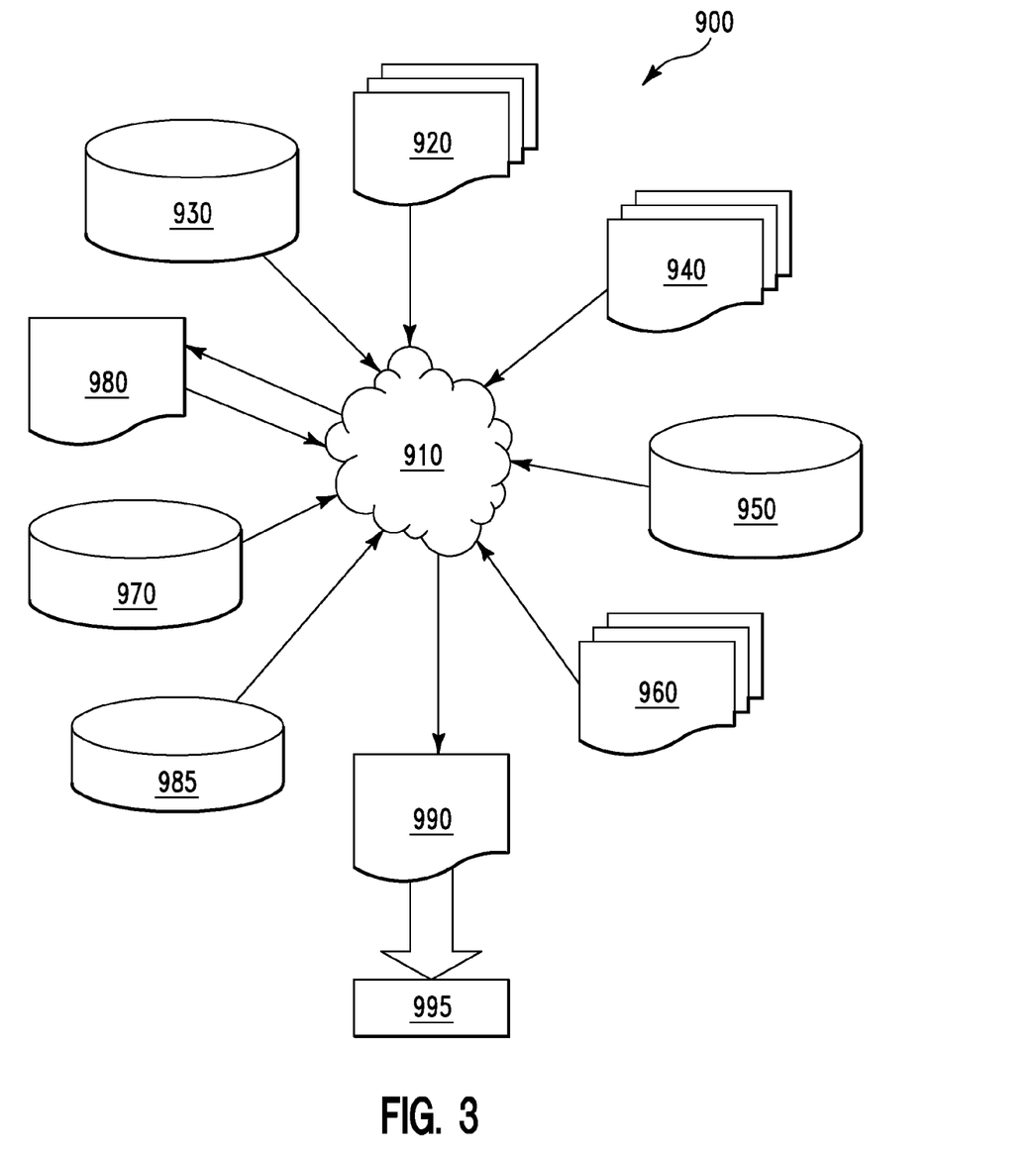
FIG. 3 is a flow diagram of a design process used in semiconductor design, manufacture, and/or test.

FIG. 3 shows a block diagram of an exemplary design flow 900 used for example, in semiconductor IC logic design, simulation, test, layout, and manufacture. Design flow 900 includes processes and mechanisms for processing design structures or devices to generate logically or otherwise functionally equivalent representations of the design structures and/or devices described above and shown in FIGS. 1L and 2H. The design structures processed and/or generated by design flow 900 may be encoded on machine-readable transmission or storage media to include data and/or instructions that when executed or otherwise processed on a data processing system generate a logically, structurally, mechanically, or otherwise functionally equivalent representation of hardware components, circuits, devices, or systems. Design flow 900 may vary depending on the type of representation being designed. For example, a design flow 900 for building an application specific IC (ASIC) may differ from a design flow 900 for designing a standard component or from a design flow 900 for instantiating the design into a programmable array, for example a programmable gate array (PGA) or a field programmable gate array (FPGA) offered by Altera® Inc. or Xilinx® Inc.

FIG. 3 illustrates multiple such design structures including an input design structure 920 that is preferably processed by a design process 910. In one embodiment, the design structure 920 comprises design data used in a design process and comprising information describing an embodiment of the invention with respect to the structure as shown in FIGS. 1L and 2H. The design data in the form of schematics or HDL, a hardware-description language (e.g., Verilog, VHDL, C, etc.) may be embodied on one or more machine readable media. For example, design structure 920 may be a text file, numerical data or a graphical representation of an embodiment of the invention as shown in FIGS. 1L and 2H. Design structure 920 may be a logical simulation design structure generated and processed by design process 910 to produce a logically equivalent functional representation of a hardware device. Design structure 920 may also or alternatively comprise data and/or program instructions that when processed by design process 910, generate a functional representation of the physical structure of a hardware device. Whether representing functional and/or structural design features, design structure 920 may be generated using electronic computer-aided design (ECAD) such as implemented by a core developer/designer. When encoded on a machine-readable data transmission, gate array, or storage medium, design structure 920 may be accessed and processed by one or more hardware and/or software modules within design process 910 to simulate or otherwise functionally represent an electronic component, circuit, electronic or logic module, apparatus, device, or system such as those shown in FIGS. 1L and 2H. As such, design structure 920 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 910 preferably employs and incorporates hardware and/or software modules for synthesizing, translating, or otherwise processing a design/simulation functional equivalent of the components, circuits, devices, or logic structures shown in FIGS. 1L and 2H to generate a netlist 980 which may contain design structures such as design structure 920. Netlist 980 may comprise, for example, compiled or otherwise processed data structures representing a list of wires, discrete components, logic gates, control circuits, I/O devices, models, etc. that describes the connections to other elements and circuits in an integrated circuit design. Netlist 980 may be synthesized using an iterative process in which netlist 980 is resynthesized one or more times depending on design specifications and parameters for the device. As with other design structure types described herein, netlist 980 may be recorded on a machine-readable data storage medium or programmed into a programmable gate array. The medium may be a non-volatile storage medium such as a magnetic or optical disk drive, a programmable gate array, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 910 may include hardware and software modules for processing a variety of input data structure types including netlist 980. Such data structure types may reside, for example, within library elements 930 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 940, characterization data 950, verification data 960, design rules 970, and test data files 985 which may include input test patterns, output test results, and other testing information. Design process 910 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 910 without deviating from the scope and spirit of the invention. Design process 910 may also include modules for performing standard circuit design processes such as timing analysis, verification, design rule checking, place and route operations, etc.

Design process 910 employs and incorporates logic and physical design tools such as HDL compilers and simulation model build tools to process design structure 920 together with some or all of the depicted supporting data structures along with any additional mechanical design or data (if applicable), to generate a second design structure 990 comprising second design data embodied on a storage medium in a data format used for the exchange of layout data of integrated circuits and/or symbolic data format (e.g. information stored in a GDSII (GDS2), GL1, OASIS, map files, or any other suitable format for storing such design structures). In one embodiment, the second design data resides on a storage medium or programmable gate array in a data format used for the exchange of data of mechanical devices and structures (e.g. information stored in a IGES, DXF, Parasolid XT, JT, DRG, or any other suitable format for storing or rendering such mechanical design structures). Similar to design structure 920, design structure 990 preferably comprises one or more files, data structures, or other computer-encoded data or instructions that reside on transmission or data storage media and that when processed by an ECAD system generate a logically or otherwise functionally equivalent form of one or more of the embodiments of the invention shown in FIGS. 1L and 2H. In one embodiment, design structure 990 may comprise a compiled, executable HDL simulation model that functionally simulates the devices shown in FIGS. 1L and 2H.

Design structure 990 may also employ a data format used for the exchange of layout data of integrated circuits and/or symbolic data format (e.g. information stored in a GDSII (GDS2), GL1, OASIS, map files, or any other suitable format for storing such design data structures). Design structure 990 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described above and shown in FIGS. 1L and 2H. Design structure 990 may then proceed to a stage 995 where, for example, design structure 990: proceeds to tape-out, is released to manufacturing, is released to a mask house, is sent to another design house, is sent back to the customer, etc.

In the embodiments described above, with reference to FIGS. 1B and 1C, the gate dielectric layer 135 comprises silicon dioxide. Alternatively, the gate dielectric layer 135 can comprise a high-K dielectric material (wherein K is dielectric constant greater than 4) such as hafnium dioxide.

In the embodiments described above, with reference to FIG. 1E, the gate electrode region 160 comprises polysilicon. Alternatively, the gate electrode region 160 can comprise metal(s) so as to decrease the resistance of the gate electrode region 160.

In the embodiments described above, with reference to FIGS. 1K-1L, the spacer regions 190 is formed by (i) depositing a silicon nitride layer on top of the structure 100 of FIG. 1K and then (ii) etching back the silicon nitride layer resulting in the structure 100 of FIG. 1L. In an alternative embodiment, with reference to FIG. 1K, the nitride region 150 is completely removed resulting in a hole in place of the removed nitride region 150. Then, a spacer material is conformally deposited on top of the structure 100 such that the hole is filled with the spacer material (this can happen if the thickness of the deposited layer is more than twice the thickness of the removed nitride region 150). Then, the deposited layer is etched back resulting in a structure similar to the structure 100 of FIG. 1L, except that in the alternative embodiment, the spacer regions 190 and the cap region 150 comprise the same material (i.e., the spacer material mentioned above). In one embodiment, the spacer material is a stress engineered material so that the spacer material filling in the hole creates stress to the silicon fin region 130a (FIG. 1I) resulting in device performance improvement.

While particular embodiments of the present invention have been described herein for purposes of illustration, many modifications and changes will become apparent to those skilled in the art. Accordingly, the appended claims are intended to encompass all such modifications and changes as fall within the true spirit and scope of this invention.

The invention claimed is:

1. A semiconductor structure, comprising:
a dielectric layer;
a central semiconductor fin region on and in direct physical contact with the dielectric layer, wherein the central semiconductor fin region consists of a first semiconductor material;
a first semiconductor seed region on and in direct physical contact with the dielectric layer, wherein the first semiconductor seed region consists of the first semiconductor material; and
a first strain creating fin region, wherein the first semiconductor seed region is sandwiched between the first strain creating fin region and the dielectric layer, wherein the first strain creating fin region comprises the first semiconductor material and a second semiconductor material different than the first semiconductor material, and wherein a first atom percent of the first semiconductor material in the first semiconductor seed region is different than a second atom percent of the first semiconductor material in the first strain creating fin region,
a second semiconductor seed region on and in direct physical contact with the dielectric layer, wherein the second semiconductor seed region consists of the first semiconductor material, and wherein the central semiconductor fin region is disposed between the first and second semiconductor seed regions; and
a second strain creating fin region, wherein the second semiconductor seed region is sandwiched between the second strain creating fin region and the dielectric layer, wherein the second strain creating fin region comprises the first semiconductor material and the second semiconductor material, wherein a third atom percent of the first semiconductor material in the second semiconductor seed region is different than a fourth atom percent of the first semiconductor material in the second strain creating fin region, wherein a first direction from the dielectric layer to the central semiconductor fin region is perpendicular to the dielectric layer, wherein a height of a top surface of the central semiconductor fin region above the dielectric layer in the first direction exceeds both a height of a top surface of the first semiconductor seed region above the dielectric layer in the first direction and a height of a top surface of the second semiconductor seed region above the dielectric layer in the first direction, and wherein the height of the top surface of the central semiconductor fin region above the dielectric layer in the first direction is equal to both a height of a top surface of the first strain creating fin region above the dielectric layer in the first direction and a height of a top surface of the second strain creating fin region above the dielectric layer in the first direction.

2. The structure of claim 1, wherein the second atom percent is essentially equal to the fourth atom percent.

3. The structure of claim 1,
wherein a first external surface of the first semiconductor seed region is in direct physical contact with the dielectric layer,
wherein a second external surface of the first semiconductor seed region is in direct physical contact with the first strain creating fin region, and
wherein the first external surface of the first semiconductor seed region and the second external surface of the first semiconductor seed region are parallel to each other.

4. The structure of claim 1, wherein the first semiconductor material consists of silicon, and wherein the second semiconductor material comprises germanium and carbon.

5. The structure of claim 1,
wherein a first external surface of the central semiconductor fin region is in direct physical contact with the first strain creating fin region,
wherein a second external surface of the central semiconductor fin region is in direct physical contact with the second strain creating fin region, and
wherein the first external surface of the central semiconductor fin region and the second external surface of the central semiconductor fin region are parallel to each other.

6. The structure of claim 1, further comprising:
a first spacer region on the dielectric layer and sandwiched between the first strain creating fin region and the gate electrode region; and a second spacer region on the dielectric layer and sandwiched between the second strain creating fin region and the gate electrode region.

7. The structure of claim 6, further comprising:
wherein a height of a top surface of the first spacer region above the dielectric layer in the first direction exceeds both the height of the top surface of the first semiconductor seed region above the dielectric layer in the first direction and the height of the top surface of the second semiconductor seed region above the dielectric layer in the first direction,
wherein a height of a top surface of the second spacer region above the dielectric layer in the first direction exceeds both the height of the top surface of the first semiconductor seed region above the dielectric layer in the first direction and the height of the top surface of the second semiconductor seed region above the dielectric layer in the first direction, and
wherein a height of a top surface of both the first spacer region and the second spacer region above the dielectric layer in the first direction exceeds the height of the top surface of the central semiconductor fin region above the dielectric layer in the first direction.

8. The structure of claim 1, further comprising a dielectric film on and in direct physical contact with the central semiconductor fin region, wherein the central semiconductor fin region is sandwiched between the dielectric layer and the dielectric film.

9. A semiconductor structure, comprising:
a dielectric layer;
a central semiconductor fin region on and in direct physical contact with the dielectric layer, wherein the central semiconductor fin region consists of a first semiconductor material;
a first semiconductor seed region on and in direct physical contact with the dielectric layer, wherein the first semiconductor seed region consists of the first semiconductor material; and
a first strain creating fin region, wherein the first semiconductor seed region is sandwiched between the first strain creating fin region and the dielectric layer, wherein the first strain creating fin region comprises the first semiconductor material and a second semiconductor material different than the first semiconductor material, and wherein a first atom percent of the first semiconductor material in the first semiconductor seed region is different than a second atom percent of the first semiconductor material in the first strain creating fin region,
a gate electrode region and a gate dielectric region, wherein the gate dielectric region is sandwiched between the gate electrode region and the central semiconductor fin region, wherein the gate dielectric region electrically insulates the gate electrode region from the central semiconductor fin region, wherein a first direction from the dielectric layer to the central semiconductor fin region is perpendicular to the dielectric layer, wherein a height of a top surface of the central semiconductor fin region above the dielectric layer in the first direction exceeds a height of a top surface of the first semiconductor seed region above the dielectric layer in the first direction, and wherein the height of the top surface of the central semiconductor fin region above the dielectric layer in the first direction is equal to a height of a top surface of the first strain creating fin region above the dielectric layer in the first direction.

10. The structure of claim 9,
wherein the first semiconductor material consists of silicon, and
wherein the second semiconductor material comprises a material selected from the group consisting of germanium and carbon.

11. The structure of claim 9, wherein the gate dielectric region is in direct physical contact with the gate electrode region and the central semiconductor fin region.

12. The structure of claim 9, further comprising a dielectric cap region, wherein the dielectric cap region is sandwiched between and in direct physical contact with the gate electrode region and the gate dielectric region.

13. The structure of claim 12,
wherein the dielectric cap region comprises silicon nitride,
wherein the gate electrode region comprises poly-silicon, and
wherein the gate dielectric region comprises silicon dioxide.

14. The structure of claim 13, wherein the dielectric cap region is completely beneath the gate electrode region.

15. The structure of claim 12,
wherein the dielectric cap region comprises a stress engineered material, and
wherein the stress engineered material of the dielectric cap region creates a stress in the central semiconductor fin region.

16. The structure of claim 15,
wherein the gate electrode region comprises poly-silicon, and
wherein the gate dielectric region comprises silicon dioxide.

17. The structure of claim 9,
wherein a first external surface of the first semiconductor seed region is in direct physical contact with the dielectric layer,
wherein a second external surface of the first semiconductor seed region is in direct physical contact with the first strain creating fin region, and
wherein the first external surface of the first semiconductor seed region and the second external surface of the first semiconductor seed region are parallel to each other.

18. The structure of claim 9, wherein the first semiconductor material consists of silicon, and wherein the second semiconductor material comprises germanium and carbon.

19. The structure of claim 9, further comprising:
a first spacer region on the dielectric layer and sandwiched between the first strain creating fin region and the gate electrode fin region,
wherein a height of a top surface of the first spacer region above the dielectric layer in the first direction exceeds the height of the top surface of the first semiconductor seed region above the dielectric layer in the first direction, and
wherein a height of a top surface of the first spacer region above the dielectric layer in the first direction exceeds the height of the top surface of the central semiconductor fin region above the dielectric layer in the first direction.

20. The structure of claim 9, further comprising a dielectric film on and in direct physical contact with the central semiconductor fin region, wherein the central semiconductor fin region is sandwiched between the dielectric layer and the dielectric film.

* * * * *